United States Patent [19]

Bargon et al.

[11] 4,389,482

[45] Jun. 21, 1983

[54] PROCESS FOR FORMING PHOTORESISTS WITH STRONG RESISTANCE TO REACTIVE ION ETCHING AND HIGH SENSITIVITY TO MID- AND DEEP UV-LIGHT

[75] Inventors: Joachim Bargon, Los Gatos; Hiroyuki Hiraoka, Saratoga; Lawrence W. Welsh, Jr., Los Gatos, all of Calif.

[73] Assignee: International Business Machines Corporation, Armonk, N.Y.

[21] Appl. No.: 330,103

[22] Filed: Dec. 14, 1981

[51] Int. Cl.$^3$ ................................................ G03C 5/24
[52] U.S. Cl. .................................... 430/325; 430/326; 430/327; 430/328; 430/330; 430/323
[58] Field of Search ............... 430/325, 327, 328, 330, 430/296, 910, 270, 323, 326

[56] References Cited

U.S. PATENT DOCUMENTS 2,887,376  5/1959  Tupis ................................ 430/910
3,914,462 10/1975  Morishita et al. ................ 430/296
3,984,582 10/1976  Feder et al. ..................... 430/330
4,080,246  3/1978  Battisti et al. ................... 156/656
4,132,586  1/1979  Schaible et al. ................. 156/643
4,184,909  1/1980  Chang et al. .................... 156/643

OTHER PUBLICATIONS

Bayer et al.: *Vacuum Baking of Photoresist-Coated Wafers for High Current Ion Implant Processing,* IBM Technical Disclosure Bulletin, vol. 22, No. 5, Oct. 1979.

*Primary Examiner*—Won H. Louie, Jr.
*Attorney, Agent, or Firm*—Joseph G. Walsh

[57] ABSTRACT

A photoresist that has strong resistance to reactive ion etching, high photosensitivity to mid- and deep UV-light, and high resolution capability is formed by using as the resist material a copolymer of methacrylonitrile and methacrylic acid, and by baking the resist before the exposure to light for improved photosensitivity, and after exposure to light, development, and prior to treatment with reactive ion etching.

5 Claims, No Drawings

PROCESS FOR FORMING PHOTORESISTS WITH STRONG RESISTANCE TO REACTIVE ION ETCHING AND HIGH SENSITIVITY TO MID- AND DEEP UV-LIGHT

DESCRIPTION

1. Technical Field

The present disclosure is concerned with photoresists. In particular, it is concerned with photoresists that have deep UV- and mid UV-light sensitivity, high resolution capability, and high resistance to reactive ion etching.

2. Background Art

The use of photoresists is well known in the art. Particularly in the manufacture of microcircuits, it is often highly desirable to have a photoresist which is very resistant to reactive ion etching. The state of the prior art is illustrated, for example by U.S. Pat. Nos. 4,080,246, 4,132,586 and 4,184,909. As may be seen from an inspection of these patents, none of them teaches the resist composition employing the process of the present invention, and also none of them teaches the baking step which is essential to the process of the present invention.

DISCLOSURE OF THE INVENTION

According to the present invention, there is formed a patterned photoresist having great resistance to reactive ion etching. The process of the present invention is characterized by two differences over the prior art; (1) the resist material is a copolymer of methacrylonitrile and methacrylic acid; and (2) the resist is baked before and also after it has been exposed to light and before it is treated with reactive ion etching.

The process of the present invention is very useful in photolithography employing deep ultra violet light, i.e. light around 250 nm. When such deep ultra violet light is used, a positive photoresist is obtained. In sharp contrast to this behavior, however, when light of the wavelength 300 nm or longer is used, the resist becomes a negative resist. This unexpected result means that the present invention has the advantage of being adaptable for use as either a positive resist or a negative resist, depending upon the wavelength of light used.

A key feature of the present invention is the baking process, which takes place in two stages: one before the exposure to UV-light and the other after the resist has been imagewise exposed to light, developed, but before the resist is subjected to reactive ion etching. The first baking for increased photosensitivity should last from about 10 minutes to about 30 minutes and be at a temperature of from about 120° C. to about 140° C. The second baking for high reactive ion etching resistance should last about 30 minutes at a temperature of from about 140° C. to about 150° C.

The resists of the present invention may be employed using a sensitizer when it is so desired. Particularly good results have been obtained using as a sensitizer p-t-butyl benzoic acid.

BEST MODE FOR CARRYING OUT THE INVENTION

Synthesis of the copolymers: The copolymers were synthesized from the freshly distilled monomers with benzoyl peroxide as a catalyst; the polymerization was carried out in vacuum at 60° to 65° C. The copolymer of (1:1) methacrylonitrile-methacrylic acid (on a molar basis) or of a higher content of methacrylonitrile appears to be best suited for our purpose. The results shown in this application are those with the (1:1) copolymer.

Resist Films: The copolymer was dissolved in diglyme; 20% solid part in solution was used. The films were spin-coated at 1800 rpm for 1 minute onto a silicon wafer. The films were prebaked in air for 10 minutes at 127° C. For the purpose of photosensitization, t-butylbenzoic acid was added up to 10% of the solid part of the resist solution.

UV-Light Exposures: The ultra violet light exposures were carried out with a medium pressure mercury lamp (Hanovia SH-type, 120 watts input energy) or a low pressure mercury lamp (GE Germicidal lamp, 15 watts) through a quartz mask or a copper grid wire. A deep ultra violet photomask has been made with a quartz substrate from a common photomask, which does not transmit light below 3000 Å. A contact printing mode was used to get high resolution patterns.

Developments of Polymer Patterns: Several developers have been tested with mild stirring: methanol, warm methanol, ethanol, ethanol and $H_2O$, acetone and $H_2O$. For developments of high resolution polymer patterns, aqueous ethanol appears to be most satisfactory.

Comparison of Relative Photosensitivity: With a copper grid wire with 50 $\mu$m line width, the 254 nm (low pressure mercury lamp) irradiations were carried out for the copolymer, the sensitized copolymer and poly methylmethacrylate (PMMA). PMMA films were spin-coated from a chlorobenzene solution, and developed in chlorobenzene. The photosensitivity criterion is the exposure time required to get the same remaining film thickness (~1 $\mu$m) of the resist after complete development. Such comparison of the exposure time has been carried out for the samples exposed to deep ultra violet light under the identical condition.

RIE Resistance Measurements: The equipment has a 12 inch diameter target in a diode type system. For the present Reaction Ion Etching (RIE) resistance measurements, 500 volt bias potential at 150 watt operating power has been established. The $CF_4$ gas pressure was maintained at $2.5 \times 10^{-4}$ torr. The relative etch resistance has been measured either by weight loss of the resist films coated on aluminum wafers or on silicon wafers, or by an end-point detector; both results agree with each other within an experimental error.

RESULTS

Ultra Violet Spectra of the Prebaked Copolymer: The prebaked copolymer (methacrylonitrile-methacrylic acid) has a new ultra violet absorption spectrum with the maximum at 246 nm, which is absent in the original copolymer. This new ultraviolet absorption is the basis of the photosensitivity.

Rie-resistance: The RIE resistance of the copolymer (methacrylonitrile-methacrylic acid) after heating at 120° C. is far better than PMMA and poly(methyl-isopropyl-ketone).

Relative Photosensitivity: Under the 254 nm irradiation the copolymer (methacrylonitrile-methacrylic acid) required only 1/10 or less the exposure time to develop the polymer patterns completely in comparison with PMMA. The photosensitized copolymer with 10% t-butylbenzoic acid requires only 1/120 or less the exposure time relative to PMMA. This result indicates that the copolymer has a sensitivity at least 10 times or more higher than PMMA, and the photosensitized copolymer has at least 120 times higher sensitivity than PMMA.

Polymer Patterns: With the quartz mask, the polymer patterns were generated. Submicron lines with a micron thickness have been demonstrated to be fabricated. Vertical wall-profiles and slightly under-cuttings have also been demonstrated.

$SiO_2$/Si Patterns: Before dry etching, the polymer patterns were post-baked at 145° C. for 30 minutes. From the SEM pictures of the $SiO_2$/Si patterns obtained by RIE, the scallop parts of the polymer patterns are shown to be extremely RIE resistant. A long exposure of the resist patterns to the RIE removed completely the resist layers. Vertical wall profiles of the $SiO_2$/Si patterns and its extended scallop indicates that the edge parts of the polymer patterns are at least twice as RIE etch resistance as $SiO_2$/Si.

The $SiO_2$/Si patterns obtained by the $CF_4$-plasma do not have scallop. The etching took place more isotropically. In the plasma, the resist films were extremely etch resistant; the patterns were made after 30 min $CF_4$-plasma, followed subsequently by oxygen plasma for 20 minutes.

USE AS NEGATIVE RESIST

The wafers were processed exactly in the same way as described above prior to the exposure. Different from the previous case, an ordinary Pyrex photo-mask with cut-off at 3000 Å was used. In the 2537 Å exposure, we have used a quartz mask which was made from the present Pyrex photomask by aluminum deposition. Thus, negative photoresists with a Pyrex photomask and positive photoresists with the quartz mask should provide the same patterns. This has happened, as shown in SEM pictures.

The copolymer (methacrylonitrile-methacrylic acid) has 10% p-t-butyl-benzoic acid as a sensitizer; because the copolymer prior to baking does not have any uv-absorption above 2800 Å, the uv-absorption is solely due to the sensitizer, t-butyl benzoic acid. The benzoic acid has a weak absorption around 3000 Å extending to 3200 Å.

After 5-minute exposure through a Pyrex photomask to a medium pressure mercury lamp, the wafers were developed in (10:1) $EtOH$-$H_2O$ developer for several hours.

As was shown clearly in SEM pictures, the polymer yielded negative patterns with vertical or slightly undercutting wall-profiles which were suited for a single step lift-off process. In all other negative photoresists, sloped wall-profiles are obtained. Even positive photoresists never gave such vertical wall-profiles except deep ultra violet photoresists.

We claim:

1. In a process for forming a patterned photoresist by pattern-wise exposing a resist material to light and developing with a solvent, the improvement of increasing the resistance of the resist to reactive ion etching by employing as the resist a copolymer of methacrylonitrile and methacrylic acid and by baking the resist in two stages, one before and one after the exposure to light with the first baking being at a temperature and for a time sufficient to increase the photosensitivity of the photoresist, and with the second baking being at a temperature and for a time sufficient to increase the ion etching resistance of the patterned photoresist.

2. In a process as claimed in claim 1 wherein the first baking is at a temperature of from about 120° C. to about 140° C. for a time of from about 10 to about 30 minutes, and the second baking is at a temperature of from about 140° C. to about 150° C. for from about 10 to about 30 minutes.

3. A process as claimed in claim 1 in which a positive resist is obtained by pattern-wise exposure of the resist to deep ultra violet radiation.

4. A process as claimed in claim 1 in which a negative resist is obtained by pattern-wise exposure of the resist to light of wavelength 300 nm or longer.

5. A process as claimed in claim 1 in which the resist has been sensitized by the presence of an additive.

* * * * *